United States Patent
Nakata et al.

(10) Patent No.: US 12,009,332 B2
(45) Date of Patent: Jun. 11, 2024

(54) SEMICONDUCTOR DEVICE HAVING HIGH YIELD STRENGTH INTERMEDIATE PLATE

(71) Applicant: Mitsubishi Electric Corporation, Tokyo (JP)

(72) Inventors: Yosuke Nakata, Tokyo (JP); Taishi Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 260 days.

(21) Appl. No.: 16/088,455

(22) PCT Filed: Jul. 28, 2016

(86) PCT No.: PCT/JP2016/072158
§ 371 (c)(1),
(2) Date: Sep. 26, 2018

(87) PCT Pub. No.: WO2018/020640
PCT Pub. Date: Feb. 1, 2018

(65) Prior Publication Data
US 2019/0157235 A1  May 23, 2019

(51) Int. Cl.
*H01L 23/00* (2006.01)
*H01L 21/52* (2006.01)
*H01L 23/48* (2006.01)

(52) U.S. Cl.
CPC ............. *H01L 24/32* (2013.01); *H01L 21/52* (2013.01); *H01L 23/48* (2013.01); *H01L 24/29* (2013.01);
(Continued)

(58) Field of Classification Search
CPC .......... H01L 2224/26155; H01L 24/26; H01L 24/32; H01L 24/29; H01L 24/30;
(Continued)

(56) References Cited

U.S. PATENT DOCUMENTS 4,783,722 A * 11/1988 Osaki ................. H01L 23/5385
174/261
5,188,280 A * 2/1993 Nakao ................. H01L 21/4853
228/123.1
(Continued)

FOREIGN PATENT DOCUMENTS

DE  11 2010 006 032 T5   10/2013
JP        S56-065650 U     6/1981
(Continued)

OTHER PUBLICATIONS

International Search Report issued in PCT/JP2016/072158; dated Sep. 20, 2016.
(Continued)

*Primary Examiner* — Eric W Jones
(74) *Attorney, Agent, or Firm* — Studebaker & Brackett PC

(57) ABSTRACT

A semiconductor chip (3) is bonded to an upper surface of an electrode substrate (1) via a first solder (2). A lead frame (5) is bonded to an upper surface of the semiconductor chip (3) via a second solder (4). An intermediate plate (6) is provided in the first solder (2) between the electrode substrate (1) and the semiconductor chip (3). A yield strength of the intermediate plate (6) is higher than yield strengths of the electrode substrate (1) and the first solder (2) within the whole operating temperature range of the semiconductor device.

19 Claims, 3 Drawing Sheets

(52) U.S. Cl.
CPC .............. *H01L 24/30* (2013.01); *H01L 24/33* (2013.01); *H01L 24/83* (2013.01); *H01L 2224/26155* (2013.01); *H01L 2224/29155* (2013.01); *H01L 2224/30181* (2013.01); *H01L 2224/32245* (2013.01); *H01L 2224/33181* (2013.01); *H01L 2224/83007* (2013.01); *H01L 2224/83065* (2013.01); *H01L 2224/83815* (2013.01); *H01L 2924/014* (2013.01); *H01L 2924/10272* (2013.01); *H01L 2924/351* (2013.01)

(58) Field of Classification Search
CPC ......... H01L 24/33; H01L 24/83; H01L 21/52; H01L 23/48; H01L 2224/29155; H01L 2224/30181; H01L 2224/32245; H01L 2224/33181; H01L 2224/83007; H01L 2224/83065; H01L 2224/83815; H01L 2924/014; H01L 2924/10272; H01L 2924/351
USPC ......................................................... 257/666
See application file for complete search history.

(56) References Cited

U.S. PATENT DOCUMENTS

| | | | | | |
|---|---|---|---|---|---|
| 5,404,637 | A | * | 4/1995 | Kawakami | H05K 3/3447 174/263 |
| 5,424,578 | A | * | 6/1995 | Fujita | H01L 21/565 257/666 |
| 6,070,321 | A | * | 6/2000 | Brofman | B23K 1/0016 29/840 |
| 6,197,618 | B1 | * | 3/2001 | Guillot | H01L 24/27 257/E21.51 |
| 6,283,359 | B1 | * | 9/2001 | Brofman | B23K 35/0222 228/180.21 |
| 7,968,801 | B2 | * | 6/2011 | Kinoshita | H05K 3/3436 174/261 |
| 9,142,498 | B2 | | 9/2015 | Noh | H01L 23/49811 |
| 9,831,202 | B2 | * | 11/2017 | Seo | H01L 24/13 |
| 9,842,953 | B2 | * | 12/2017 | Endo | H01L 31/02008 |
| 2002/0109152 | A1 | * | 8/2002 | Kobayashi | H01L 23/3735 257/177 |
| 2004/0078964 | A1 | * | 4/2004 | Itou | H05K 3/3447 29/840 |
| 2004/0104469 | A1 | * | 6/2004 | Yagi | G06K 19/07 257/723 |
| 2004/0111882 | A1 | * | 6/2004 | Nakamura | H01L 21/4857 29/846 |
| 2004/0194861 | A1 | * | 10/2004 | Endou | C22C 9/00 148/432 |
| 2007/0057021 | A1 | * | 3/2007 | Ikeda | B23K 35/262 228/101 |
| 2007/0274047 | A1 | * | 11/2007 | Nagase | H01L 23/3735 361/704 |
| 2008/0076307 | A1 | * | 3/2008 | Nishi | H01L 31/0512 439/886 |
| 2009/0186195 | A1 | * | 7/2009 | Spraker | B23K 1/0006 428/172 |
| 2012/0235291 | A1 | * | 9/2012 | Uchida | H01L 23/367 257/706 |
| 2013/0235636 | A1 | | 9/2013 | Kadoguchi et al. | |
| 2014/0145341 | A1 | * | 5/2014 | Tanaka | H01L 23/49513 257/771 |
| 2014/0264829 | A1 | * | 9/2014 | Shahidi | H01L 21/4853 257/737 |
| 2016/0113107 | A1 | * | 4/2016 | Wang | H01L 23/49833 361/783 |
| 2016/0155714 | A1 | * | 6/2016 | Hilsenbeck | H01L 24/05 257/762 |

FOREIGN PATENT DOCUMENTS

| | | |
|---|---|---|
| JP | S56-172938 U | 12/1981 |
| JP | 2003-133337 A | 5/2003 |
| JP | 2010-10505 A | 1/2010 |
| JP | 2013-113638 A | 6/2013 |
| JP | 2014-41876 A | 3/2014 |
| JP | 2015-65350 A | 4/2015 |
| JP | 2016-046403 A | 4/2016 |
| WO | 2015/029186 A1 | 3/2015 |

OTHER PUBLICATIONS

Written Opinion issued in PCT/JP2016/072158; dated Sep. 20, 2016.
Notification of Transmittal of the International Search Report and the Written Opinion of the International Searching Authority, or the Declaration issued in PCT/JP2016/072158; dated Sep. 20, 2016.
"Table 33 Physical properties of practical metals and alloys" Nippon Welding Rod Co., Ltd. (online) (2012) [Search Date: Sep. 9, 2016] < http://www.nihonwel.co.jp/pdf_data/Capter17/alloy%20property.pdf> with partial English translation.
An Office Action mailed by the Japanese Patent Office dated Oct. 23, 2019, which corresponds to Japanese Patent Application No. 2018-530284 and is related to U.S. Appl. No. 16/088,455.
An Office Action; "Notice of Reasons for Refusal," mailed by the Japanese Patent Office dated May 26, 2020, which corresponds to Japanese Patent Application No. 2018-530284 and is related to U.S. Appl. No. 16/088,455; with partial English language translation.
An Office Action mailed by China National Intellectual Property Administration dated Dec. 13, 2021, which corresponds to Chinese Patent Application No. 201680087903.5 and is related to U.S. Appl. No. 16/088,455; with English language translation.
An Office Action mailed by the German Patent and Trademark Office dated Jan. 3, 2022, which corresponds to German Patent Application No. 112016007096.9 and is related to U.S. Appl. No. 16/088,455; with English language translation.

* cited by examiner

SEMICONDUCTOR DEVICE HAVING HIGH YIELD STRENGTH INTERMEDIATE PLATE

FIELD

The present invention relates to a power semiconductor device such as an IGBT, a MOSFET, or a diode.

BACKGROUND

There is disclosed a semiconductor device in which a semiconductor chip is bonded to an aluminum electrode substrate via solder and a copper electrode is bonded to the upper surface of the semiconductor chip via solder (for example, see PTL 1).

CITATION LIST

Patent Literature

[PTL 1] WO 2015/029186

SUMMARY

Technical Problem

However, there exists a point where a yield strength relation between the aluminum electrode substrate and the solder is reversed within a temperature range in cooling/heating cycles and power cycles, that is, an operating temperature range of the semiconductor device. Therefore, the aluminum electrode substrate and the solder are deformed and do not return to the individual original positions. Furthermore, when the deformation amounts thereof are accumulated to be large, the semiconductor chip is finally deformed, which problematically causes deterioration of its reliability. In particular, for an SiC chip usable at high temperature or the like, the operating temperature range is wide, which causes large temperature stress.

For example, deformation of a semiconductor chip can be suppressed by covering the upper surface of the semiconductor chip with transfer molding resin. However, in the semiconductor device in which solder bonding on the upper surface of a semiconductor chip is performed, since the upper surface of the semiconductor chip is covered by solder, which tends to be deformed, it cannot be fixed with the molding resin, and therefore, it is problematically difficult for deformation of the semiconductor chip to be suppressed.

The present invention is devised in order to solve the problems as above, and an object thereof is to obtain a semiconductor device capable of improving reliability regarding cooling/heating cycles and power cycles.

Solution to Problem

A semiconductor device according to the present invention includes: an electrode substrate; a semiconductor chip bonded to an upper surface of the electrode substrate via a first solder; a lead frame bonded to an upper surface of the semiconductor chip via a second solder; and an intermediate plate provided in the first solder between the electrode substrate and the semiconductor chip, wherein a yield strength of the intermediate plate is higher than yield strengths of the electrode substrate and the first solder within the whole operating temperature range of the semiconductor device.

Advantageous Effects of Invention

In the present invention, the intermediate plate is provided in the first solder between the electrode substrate and the semiconductor chip. Further, the yield strength of the intermediate plate is higher than the yield strengths of the electrode substrate and the first solder within the whole operating temperature range of the semiconductor device. Therefore, reliability regarding cooling/heating cycles and power cycles can be improved.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
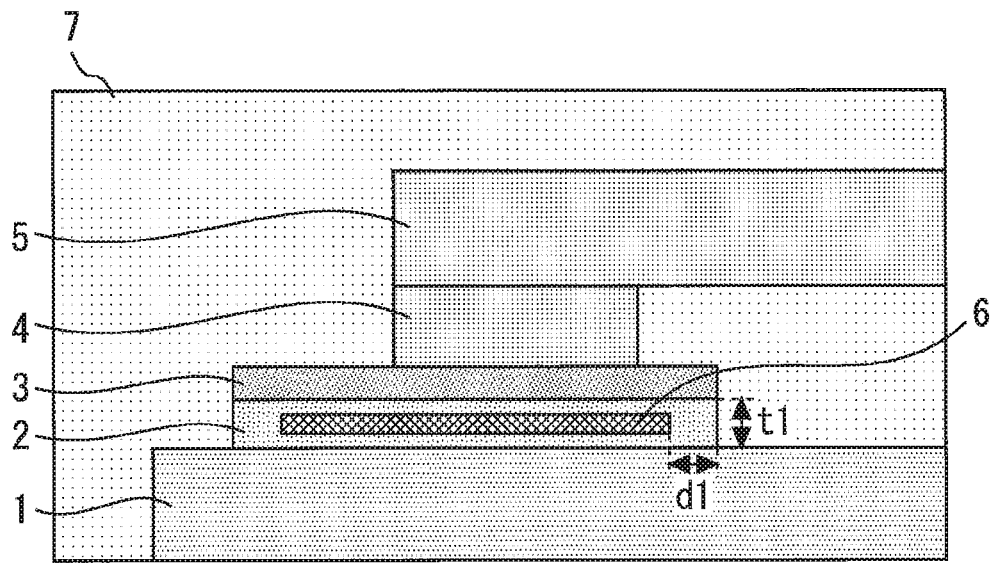
FIG. 1 is a cross-sectional view illustrating a semiconductor device according to Embodiment 1.

FIG. 1 is a cross-sectional view illustrating a semiconductor device according to Embodiment 1. The semiconductor device according to the present embodiment is used for a power supply which drives, for example, a motor for vehicular power. A semiconductor chip 3 is bonded to the upper surface of an electrode substrate 1 via a first solder 2. A lead frame 5 is bonded to the upper surface of the semiconductor chip 3 via a second solder 4.

The semiconductor chip 3 is a switching semiconductor device such as an IGBT or a MOSFET, or a freewheeling semiconductor device such as a diode, these being formed, for example, of silicon. The thickness of the semiconductor chip 3 is optimized in accordance with the withstand voltage class thereof. For example, with the voltage of a lithium ion battery which is often used for a hybrid vehicle or an electric vehicle taken into consideration, the withstand voltage class of the semiconductor chip 3 is desirably 600 V to 800 V. In order to improve electric characteristics, in particular, a DC loss, the thickness of the semiconductor chip 3 is desirably 100 μm or less.

The electrode substrate 1 is formed, for example, on an insulating substrate into a plate shape by rolling or casting. Notably, on the lower surface of the insulating substrate, a conductor substrate is provided and a plurality of cooling projections are provided on the conductor substrate. By directly bringing cooling water onto the conductor substrate and the plurality of cooling projections, heat generated from the semiconductor chip 3 can be efficiently cooled. The electrode substrate 1, the conductor substrate and the plurality of cooling projections can be integrally formed by being casted to surround the insulating substrate through aluminum casting. The main material of the electrode substrate 1 and the like is aluminum. Thereby, corrosion resistance against the cooling water is secured while electric and thermal conductivity is maintained, and costs and weight can be suppressed. Moreover, in order to improve thermal conduction, aluminum with 99% or more of high purity is desirable.

The first and second solders 2 and 4 are, for example, Sn—Cu-based, Sn—Ag-based or Sn—Ag—Cu-based lead-free solder. Thereby, the semiconductor chip 3 can be easily electrically and thermally bonded to the lead frame 5 or the electrode substrate 1 in a reducing atmosphere. Further, the first and second solders 2 and 4 can maintain their solid phase states even at or below 200° C. which is an operating temperature range of the semiconductor chip 3.

The main material of the lead frame 5 is, for example, copper. The lead frame 5 is processed into an arbitrary shape by punching processing after a Cu plate material is formed, for example, by rolling a Cu material. The lead frame 5 is electrically connected to the second solder 4.

Notably, solder bonding metal films composed of materials containing Ni are individually formed on the upper surface and the lower surface of the semiconductor chip 3 by an electroplating method, sputtering, or a vapor phase deposition method such as vapor deposition. The solder bonding metal films on the upper surface and the lower surface are electrically and thermally connected respectively to the first and second solders 2 and 4.

Between the electrode substrate 1 and the semiconductor chip 3, an intermediate plate 6 is provided in the first solder 2. The main material of the intermediate plate 6 is copper. The intermediate plate 6 is processed into an arbitrary shape by punching processing after a Cu plate material is formed, for example, by rolling a Cu material.

The upper surface of the electrode substrate 1, the first solder 2, the semiconductor chip 3, the second solder 4, the intermediate plate 6 and a part of the lead frame 5 are covered by a sealing material 7. As the sealing material 7, transfer molding resin or potting resin can be used. The semiconductor chip 3 can be suppressed from being deformed at the portion where the sealing material 7 is in direct contact with the semiconductor chip 3.

Subsequently, a manufacturing method of the semiconductor device according to the present embodiment is described. First, the intermediate plate 6, the first solder 2 and the semiconductor chip 3 are sequentially stacked on the electrode substrate 1. Next, the first solder 2 is heated and melted in a reducing atmosphere, and the lower surface of the semiconductor chip 3 is electrically and thermally bonded to the upper surface of the electrode substrate 1 via the first solder 2 and the intermediate plate 6. In order to gain the maximum thermal bonding, it is desirable for almost the whole surface of the lower surface of the semiconductor chip 3 to be bonded. Moreover, in order to prevent voids from arising due to air drawn into the first solder 2, it is desirable for the air to be discharged from the first solder 2 by melting the first solder 2 under a reduced pressure, and after that, recovering the pressure. The order of stacking the intermediate plate 6 and the first solder 2 may be reversed. In this case, when the intermediate plate 6 is placed right below the semiconductor chip 3, by performing the placement such that burrs of the intermediate plate 6 due to the punching processing face the first solder 2 side, the semiconductor chip 3 can be prevented from being damaged, which can improve the yield.

Next, the lead frame 5 is electrically connected to the upper surface of the semiconductor chip 3 using the second solder 4. Herein, the upper surface of the semiconductor chip 3 is not needed to be thermally bonded to the lead frame 5. Moreover, it is needed to secure the creeping distance between the end part of the semiconductor chip 3 and the lead frame 5. Further, it is needed to connect signal terminals on the upper surface of the semiconductor chip 3 to external electrodes using conductor wires or the like. Therefore, the lead frame 5 is bonded partially to the upper surface of the semiconductor chip 3. Next, the upper surface of the electrode substrate 1, the first solder 2, the semiconductor chip 3, the second solder 4, the intermediate plate 6 and at least part of the lead frame 5 are covered by the sealing material 7. Through the process above, the semiconductor device according to the present embodiment is manufactured.

Figure 2:
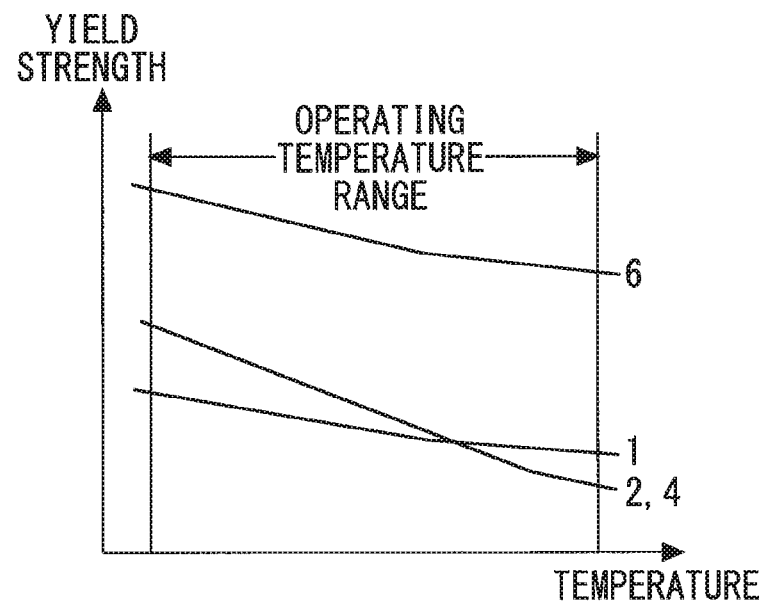
FIG. 2 is a diagram illustrating temperature dependencies of yield strengths of the electrode substrate, the first and second solders and the intermediate plate.

FIG. 2 is a diagram illustrating temperature dependencies of yield strengths of the electrode substrate, the first and second solders and the intermediate plate. Herein, the yield strength indicates the 0.2% yield strength, which is a stress causing 0.2% plastic strain in unloading for many metal materials which do not exhibit a yield phenomenon. There exists a point where magnitude relation between the yield strength of the electrode substrate 1 and the yield strength of the first and second solders 2 and 4 is reversed within an operating temperature range of the semiconductor device. Accordingly, the first solder 2 and the electrode substrate 1 are deformed in different temperature ranges. For example, the electrode substrate 1 is hardly deformed when the first solder 2 is deformed, and the first solder 2 is hardly deformed when the electrode substrate 1 is deformed. Therefore, the position of each material does not return to the original one but the deformation amount thereof is accumulated. The deformation amount increases due to repetition of cooling/heating cycles.

Therefore, in the present embodiment, the intermediate plate 6 is provided in the first solder 2 between the electrode substrate 1 and the semiconductor chip 3. Further, the yield strength of the intermediate plate 6 is higher than the yield strengths of the electrode substrate 1 and the first solder 2 within the whole operating temperature range of the semiconductor device. Accordingly, even when the electrode substrate 1 and the first solder 2 are deformed during cooling/heating cycles, the intermediate plate 6 is not deformed, and hence, the semiconductor chip 3 can be suppressed from being deformed. In particular, right below the second solder 4, since the semiconductor chip 3 is not in direct contact with the sealing material 7, the sealing material 7 does not reach it in terms of its force of fixing. In the case of deformation of the second solder 4 due to stress caused by cooling/heating cycles and power cycles, the force of constraint is lost and the semiconductor chip 3 tends to result in deformation. On the contrary, since the intermediate plate 6 which is hardly deformed is provided below the semiconductor chip 3, the semiconductor chip 3 can be suppressed from being deformed. As a result, reliability regarding cooling/heating cycles and power cycles can be improved. Notably, while in the present embodiment, the materials of the first and second solders 2 and 4 are the same, even if they are different materials, the similar effect can be obtained as long as they have the aforementioned yield strength relation.

Moreover, in the case of using a semiconductor chip usable at high temperature, such as silicon carbide, the high temperature side of the operating temperature range is expanded up to 200° C. Moreover, for automobile application, the low temperature side thereof is expanded down to −55° C. Therefore, the deformation amounts of the electrode substrate 1 and the first solder 2 tend to become large, and it is needed for deformation of the semiconductor chip 3 to be suppressed by the intermediate plate 6.

Moreover, stress due to cooling/heating cycles arises caused by a difference in coefficient of linear expansion between the intermediate plate 6 and the first solder 2. This stress reaches its maximum at the end parts of the semiconductor chip 3. If the first solder 2 is segmented by the intermediate plate 6, the thickness of the first solder 2 becomes small at the end parts of the semiconductor chip 3, which causes large stress. In particular, if the intermediate plate 6 is inclined in the first solder 2, the thickness of the end part of the first solder 2 partially becomes further smaller, which causes significantly larger stress. Therefore, the intermediate plate 6 is made smaller than the semiconductor chip 3 and the first solder 2, and it is positioned inward of the semiconductor chip 3 and the first solder 2 in planar view. Thereby, the intermediate plate 6 can be completely buried in the first solder 2, and the first solder 2 can be prevented from being segmented at the end part of the first solder 2 by the intermediate plate 6. As a result, reliability regarding cooling/heating cycles can be further improved.

Moreover, the end parts of the intermediate plate 6 are withdrawn inward from the end parts of the semiconductor chip 3, and the intermediate plate 6 is set not to be exposed from the first solder 2. Specifically, a distance d1 between the end part of the semiconductor chip 3 and the end part of the intermediate plate 6 is set to be larger than a thickness t1 of the first solder 2. Thereby, even if the intermediate plate 6 is inclined in the first solder 2, the thickness of the first solder 2 does not become smaller at the end part of the semiconductor chip 3, which can achieve stable reliability.

Moreover, the second solder 4 is positioned inward of the intermediate plate 6 in planar view. When the second solder 4 is deformed due to stress caused by power cycles, the semiconductor chip 3 results in its deformation. Therefore, by supporting it with the intermediate plate 6, the semiconductor chip 3 can be suppressed from being deformed.

Embodiment 2

Figure 3:
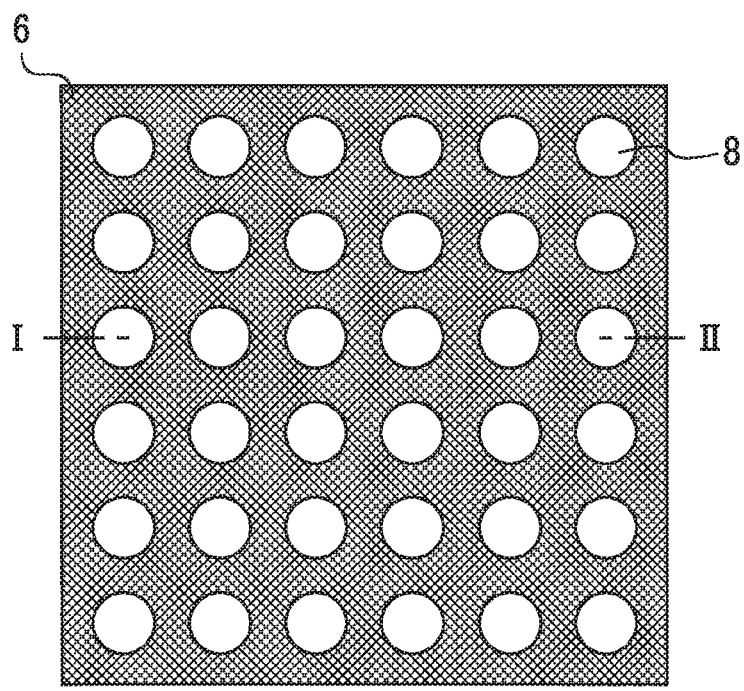
FIG. 3 is a plan view illustrating an intermediate plate according to Embodiment 2.
Figure 4:
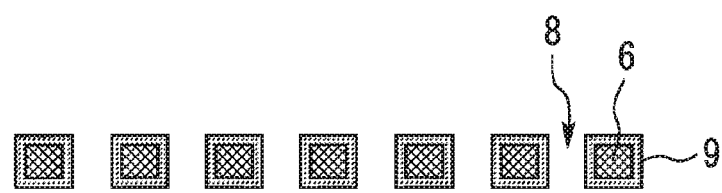
FIG. 4 is a cross-sectional view taken along I-II in FIG. 3.

FIG. 3 is a plan view illustrating an intermediate plate according to Embodiment 2. FIG. 4 is a cross-sectional view taken along I-II in FIG. 3. The present embodiment is similar to Embodiment 1 except the configuration of the intermediate plate 6.

A plurality of through holes 8 are provided in the intermediate plate 6, for example, by punching processing. Thereby, since the first solder 2 can wet and spread both the upside and the downside through the through holes 8, it is not needed for the first solder 2 to be placed on both the upper surface side and the lower surface side of the intermediate plate 6. Accordingly, the number of components for the first solder 2 and assembly operation thereof can be reduced, and production costs can be reduced.

Moreover, a plating film 9 covers the surfaces of the intermediate plate 6. The main material of the plating film 9 is nickel, and the plating film 9 has higher wettability to the first solder 2 than that of the intermediate plate 6. Thereby, since the solder wettability can be improved, a void defect rate can be reduced, and a production loss cost can be reduced.

Moreover, since the plating film 9 is formed after punching processing of the through holes 8, it is also formed on the sidewalls of the plurality of through holes 8. Thereby, since the first solder 2 also wets and spreads in the sidewalls of the through holes 8 and the insides of the through holes 8 are filled with it, voids can be suppressed from arising, and reliability can be improved.

Moreover, it is preferable that the dimension of the through hole 8 be 500 μmΦ or less. Although voids are formed in the first solder 2 when air is drawn into the plurality of through holes 8, there is a little thermal harmful influence with the void diameter being 500 μm or less, and deterioration in heat resistance and reduction in short circuit resistance hardly arise. Moreover, when air exceeding 500 μmΦ is drawn into the plurality of through holes 8, since the air void is subdivided into the plurality of through holes 8 due to the surface tension of the first solder 2, voids exceeding 500 μmΦ are hardly generated, and a production yield can be improved.

Moreover, an intermetallic compound is formed between the first solder 2 and the plating film 9. Kirkendall voids arise on this intermetallic compound due to cooling/heating cycles, which, hence, occasionally leads to solder cracks. Accordingly, similarly to Embodiment 1, it is desirable that the intermediate plate 6 is not exposed from the first solder 2.

Embodiment 3

Figure 5:
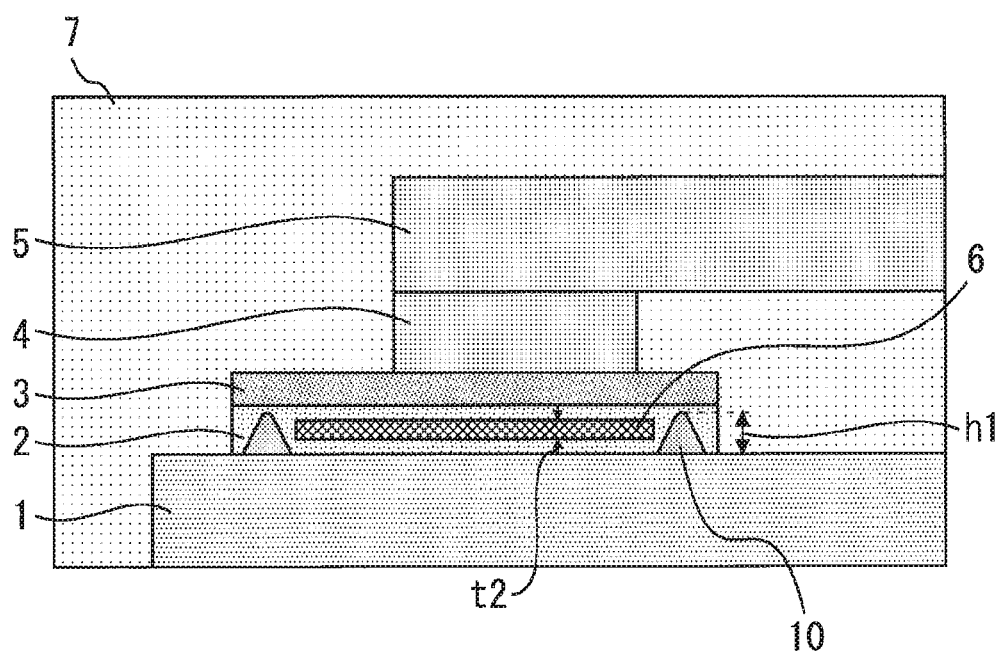
FIG. 5 is a cross-sectional view illustrating a semiconductor device according to Embodiment 3.

FIG. 5 is a cross-sectional view illustrating a semiconductor device according to Embodiment 3. Between the electrode substrate 1 and the end parts of the semiconductor chip 3, a plurality of bumps 10 are provided by using aluminum wires or the like. Since the bumps can secure the distance between the semiconductor chip 3 and the electrode substrate 1, the semiconductor chip 3 can be prevented from being implemented to be inclined and the first solder 2 can be prevented from being partially thin.

Moreover, the intermediate plate 6 is positioned inward of the plurality of bumps 10 in planar view. Thereby, movement of the intermediate plate 6 during the solder bonding step is restricted by the bumps 10, and thereby, the intermediate plate 6 can be prevented from flowing outwardly from the semiconductor chip 3 and being exposed from the first solder 2.

Moreover, a thickness t2 of the intermediate plate 6 is smaller than a height h1 of the bumps. Thereby, even if the intermediate plate 6 is inclined in the first solder 2 in the melting state during the solder bonding step, the height of the semiconductor chip 3 can be maintained by the bumps 10.

Notably, in Embodiments 1 to 3, when the thickness of the semiconductor chip 3 is 100 μm or less, although a loss of the semiconductor chip 3 can be reduced, the semiconductor chip 3 tends to be deformed to meet deformation of peripheral components. Therefore, there is high necessity to provide the intermediate plate 6 to prevent deterioration of reliability.

Moreover, the main material of the intermediate plate 6 may be molybdenum. In this case, the intermediate plate 6 is formed, for example, by rolling a molybdenum material to form a molybdenum plate material, and after that, processing it into an arbitrary shape by punching processing. Since by using molybdenum, the coefficient of linear expansion of the intermediate plate 6 is brought to be close to that of silicon, which is the main material of the semiconductor chip 3, stress generated due to the difference in coefficient of thermal expansion between both can be reduced. Accordingly, since stress exerted on the semiconductor chip 3 due to thermal cycles or power cycles can be further relieved, reliability can be further improved while electric and thermal conductivity being maintained.

Moreover, by using a compound semiconductor for the semiconductor chip 3, it can be used at or below a high temperature. In particular, by using a compound semiconductor, such as SiC having carbon, as the main material, it can be used at or below a further higher temperature. The semiconductor chip 3 formed of a wide-bandgap semiconductor having a bandgap wider than that of silicon has a high voltage resistance and a high allowable current density, and thus can be miniaturized. The use of such a miniaturized semiconductor chip 3 enables the miniaturization and high integration of the semiconductor device in which the semiconductor chip 3 is incorporated. Further, since the semiconductor chip 3 has a high heat resistance, a radiation fin of a heatsink can be miniaturized and a water-cooled part can be air-cooled, which leads to further miniaturization of the semiconductor device. Further, since the semiconductor chip 3 has a low power loss and a high efficiency, a highly efficient semiconductor device can be achieved. The wide-bandgap semiconductor is, for example, a gallium-nitride-based material, or diamond besides a silicon carbide.

REFERENCE SIGNS LIST

1 electrode substrate, 2 first solder, 3 semiconductor chip, 4 second solder, 5 lead frame, 6 intermediate plate, 9 plating film, 8 through hole, 10 bump

The invention claimed is:

1. A semiconductor device comprising:
an electrode substrate;
a semiconductor chip bonded to an upper surface of the electrode substrate via a first solder;
a lead frame bonded to an upper surface of the semiconductor chip via a second solder;
an intermediate plate provided in the first solder between the electrode substrate and the semiconductor chip; and
a plurality of bumps provided between the electrode substrate and the semiconductor chip, the plurality of bumps being comprised of wire,
wherein a yield strength of the intermediate plate is higher than yield strengths of the electrode substrate and the first solder within the whole operating temperature range of the semiconductor device,
an outermost periphery of the intermediate plate is positioned inward of an outer periphery of the semiconductor chip and the first solder in planar view,
the intermediate plate is positioned inward of the plurality of bumps in planar view, and
the uppermost height of the bumps is less than a total thickness of the first solder, such that the bump does not contact the semiconductor chip.

2. The semiconductor device according to claim 1, wherein the operating temperature range is −55° C. to 200° C.

3. The semiconductor device according to claim 1, wherein a distance between an end part of the semiconductor chip and an end part of the intermediate plate is larger than a thickness of the first solder.

4. The semiconductor device according to claim 1, wherein the second solder is positioned inward of the intermediate plate in planar view.

5. The semiconductor device according to claim 1, further comprising a plating film covering a surface of the intermediate plate and having higher wettability to the first solder than that of the intermediate plate.

6. The semiconductor device according to claim 5, wherein a main material of the plating film is nickel.

7. The semiconductor device according to claim 5, wherein a plurality of through holes are provided in the intermediate plate, and
the plating film is provided on sidewalls of the plurality of through holes.

8. The semiconductor device according to claim 1, wherein a plurality of through holes are provided in the intermediate plate.

9. The semiconductor device according to claim 8, wherein a dimension of the through hole is 500 μmΦ or less.

10. The semiconductor device according to claim 1, wherein a thickness of the intermediate plate is smaller than a height of the plurality of bumps.

11. The semiconductor device according to claim 1, wherein a thickness of the semiconductor chip is 100 μm or less.

12. The semiconductor device according to claim 1, wherein a main material of the electrode substrate is aluminum.

13. The semiconductor device according to claim 1, wherein a main material of the intermediate plate is copper.

14. The semiconductor device according to claim 1, wherein a main material of the intermediate plate is molybdenum.

15. The semiconductor device according to claim 1, wherein a compound semiconductor is used for the semiconductor chip.

16. The semiconductor device according to claim 15, wherein a main material of the compound semiconductor includes carbon.

17. The semiconductor device according to claim 1, wherein the semiconductor device is used for a power supply which drives a motor for vehicular power.

18. A semiconductor device comprising:
an electrode substrate;
a semiconductor chip bonded to an upper surface of the electrode substrate via a first solder;
a lead frame directly bonded to an upper surface of the semiconductor chip via a second solder;
an intermediate plate provided in the first solder between the electrode substrate and the semiconductor chip; and
a plurality of bumps provided between the electrode substrate and the semiconductor chip, the plurality of bumps being comprised of wire,
wherein a yield strength of the intermediate plate is higher than yield strengths of the electrode substrate and the first solder within the whole operating temperature range of the semiconductor device,
an outer periphery of the intermediate plate is positioned inward of an outer periphery of the semiconductor chip and the first solder in planar view,
the intermediate plate is positioned inward of the plurality of bumps in planar view, and
the uppermost height of the bumps is less than a total thickness of the first solder, such that the bump does not contact the semiconductor chip.

19. The semiconductor device according to claim 18, wherein a thickness of the intermediate plate is smaller than a height of the plurality of bumps.

* * * * *